United States Patent [19]
Kondo et al.

[11] Patent Number: 5,614,291
[45] Date of Patent: Mar. 25, 1997

[54] SEMICONDUCTOR DEVICE AND METHOD OF MANUFACTURING THE SAME

[75] Inventors: Ichiharu Kondo; Yoshiaki Inaguma, both of Nagoya; Yoshitsugu Sakamoto, Kariya, all of Japan

[73] Assignee: Nippondenso Co., Ltd., Kariya, Japan

[21] Appl. No.: 463,633

[22] Filed: Jun. 6, 1995

Related U.S. Application Data

[63] Continuation of Ser. No. 678,213, Apr. 1, 1991, abandoned.

[30] Foreign Application Priority Data

Jun. 28, 1990 [JP] Japan .................................... 2-171223

[51] Int. Cl.$^6$ .................................................. B32B 09/00
[52] U.S. Cl. .......................... 428/209; 428/901; 257/758; 257/766
[58] Field of Search .................................. 428/620, 641, 428/209, 901; 257/158, 761, 763, 766, 772

[56] References Cited

U.S. PATENT DOCUMENTS

| | | |
|---|---|---|
| 3,461,054 | 8/1969 | Vratny . |
| 3,516,915 | 12/1970 | Mayer et al. . |
| 3,886,585 | 5/1975 | Konantz et al. .......................... 428/620 |
| 3,945,903 | 3/1976 | Svendor et al. . |
| 4,486,511 | 12/1984 | Chen et al. ............................. 428/620 |
| 4,513,905 | 4/1985 | Nowicki et al. . |
| 4,588,343 | 5/1986 | Garrett . |
| 4,840,302 | 6/1989 | Gardner et al. .......................... 428/620 |
| 4,989,064 | 1/1991 | Kubokoya et al. ........................ 357/71 |
| 4,994,880 | 2/1991 | Kato et al. . |

FOREIGN PATENT DOCUMENTS

| | | |
|---|---|---|
| 070435 | 1/1983 | European Pat. Off. . |
| 0363673 | 4/1990 | European Pat. Off. . |
| 2809863 | 3/1977 | Germany .................................. 357/71 |
| 56-54046 | 5/1981 | Japan . |
| 0216789 | 6/1990 | Japan .................................... 428/620 |

OTHER PUBLICATIONS

Patent Abstract of Japan, vol. 10 No. 75 (E–390) Mar. 1986 re JP–A 60220939.
Patent Abstract of Japan, vol. 9 No. 89 (E–309) Apr. 1985 re JP–A 59218744.
VLSI Technology S. Sze 1983 McGraw–Hill p. 553.
Patent Abstract of Japan, vol. 007 No. 123 (E178) May 1983 re JP–A 58 040847.
"Intermetallic Compounds Formed in Soldered Joints", Japan Weldinh Society MJ–S–1–86, Sep. 18, 1986.
Thornton et al, "Internal Stresses in Titanlum, Nickel, molybdenum, and Tantalum Films Deposited by Cylindrical Magnetron Sputtering", J. Vac. Sci. Technol., vol. 14 No. 1, Jan./Feb. 1977 pp. 164–168.
Shinzato et al, "Internal Stress in Sputter–deposited Nickel Films Obtained at Various Substrate Angles with the Target", Proc. 7th ICVM, 1982, Tokyo, Japan, pp. 172–179.

*Primary Examiner*—Patrick Ryan
*Assistant Examiner*—P. Jewik
*Attorney, Agent, or Firm*—Cushman, Darby & Cushman IP Group of Pillsbury Madison & Sutro LLP

[57] ABSTRACT

A semiconductor device, including a nickel layer formed on a semiconductor substrate and a solder layer formed on the nickel layer, and a method of manufacturing such a device are disclosed. The percent ratio of an X-ray diffraction peak intensity of the (200) plane of the nickel layer to that of the (111) plane of the nickel layer is not less than 10%. The nickel layer is sputtered in a condition which a pressure of an argon discharge gas is at least 15 mTorr. The solder layer includes at least tin and lead, and the amount of tin is not more than 30% by weight. The adhesive strength of the resultant semiconductor device is strong.

25 Claims, 4 Drawing Sheets

SEMICONDUCTOR DEVICE AND METHOD OF MANUFACTURING THE SAME

This is a continuation of application Ser. No. 7/678,213, filed on Apr. 1, 1994, which was abandoned upon the filing hereof.

BACKGROUND OF THE INVENTION

1. Field of the Invention

The present invention relates to a semiconductor device having a solder layer on the rear electrode thereof, and a method o manufacturing such a semiconductor device. The present invention can be effectively adopted to a semiconductor device forming a power device therein.

2. Description of the Related Art

Consecutive sputtering of titanium, nickel and gold layers onto a semiconductor substrate or wafer to form aminated metal electrode, wherein an argon atmosphere having a pressure in the range of 2 to 10 mTorr is used during the sputtering, is generally known. This pressure range is adopted because, at a higher argon pressure, the electric resistivity of the deposited layer is high and the load on a vacuum pump becomes higher as the argon pressure is increased.

Nevertheless, in the conventional sputtering, nigh stresses occur particularly in the deposited nickel layer, thereby bending the semiconductor wafer and reducing the adhesive strength of the deposited layers.

(Prior Work)

To solve such a problem, the technique described in Japanese Patent Publication HEI 2-167890 was proposed. The technique is that the sputtering is carried out in an argon gas atmosphere wherein the pressure of the argon gas as a discharge gas is at least 15 mTorr. This forms a nickel layer having a reduced stress. The resultant ratio of the X-ray diffraction peak intensity of the (200) plane of the nickel layer to that of the (111) plane of the nickel layer is at least 10%. The nickel layer reduces the bending of the wafer and enhances the adhesive strength because of the reduced stress.

However, when the argon pressure is high like the aforementioned technique, the density of the nickel layer becomes sparse as shown in FIG. 6. Therefore, when a solder layer for connecting a rear electrode is formed on this nickel layer, the diffusion speed of tin (Sn) and lead (Pb) in the solder layer into the nickel layer is increased, and the adhesive strength of the solder is reduced.

FIG. 7 shows a measured useful life of the semiconductor in relation to the argon pressure used during sputtering. The solder used in the measurement consists of 40% tin (Sn) and 60% lead (Pb) by weight. As shown in FIG. 7, when the argon pressure is above 15 mTorr, the useful lifetime is rapidly shortened.

We believe that the following model explains the reason why the useful life is required. FIG. 8 shows an auger electron spectroscopy depth profile of a peel-off surface of a sample having a solder layer consisting of 40% tin and 60% lead by weight. The sample has a titanium (Ti) layer, a nickel (Ni) layer and a gold (Au) layer between a silicon substrate of the sample and the solder layer. The solder layer is soldered on a lead frame. The peel-off surface appeared when the silicon substrate was peeled off the lead frame. As understood from the result of this analysis, the peel-off surface of the sample is formed between a titanium (Ti) layer, which is formed in between a silicon substrate and the nickel layer, and lead of the solder.

Lead exists in tin as a solid solution. Tin having lead therein diffuses in and passes through the nickel layer during a high-temperature exposure test, and tin arrives at a interface between the titanium layer and the nickel layer. Because it is difficult for lead to diffuse in the titanium layer, lead is collected at the interface, and therefore, the strength of this portion is weakened.

When a semiconductor device having the aforementioned structure is adopted as a device for a motor vehicle, the reduced of strength due to the diffusion of the solder is a severe problem because the environmental temperature encountered by devices for motor vehicles is high (more than 100° C.).

SUMMARY OF THE INVENTION

An object of the present invention, therefore, is to enhance the adhesive strength of a solder layer of a semiconductor device.

Another object of the present invention is to provide a long-lived semiconductor device and a method of manufacturing such a device.

To accomplish the above objects, a semiconductor device according to the present invention includes a semiconductor substrate. A nickel layer is formed on the semiconductor substrate. The ratio of the X-ray diffraction peak intensity of the (200) plane of the nickel layer to that of the (111) plane of the nickel layer is at least 10%. A solder layer formed on the nickel layer includes at least tin and lead therein, with the amount of tin contained in the solder layer being less than about 30 weight %.

In a method of manufacturing the semiconductor device, a semiconductor substrate is first prepared, nickel is then sputtered onto the substrate to form a nickel layer on the semiconductor substrate. The sputtering occurs in an argon atmosphere having a pressure of at least 15 mTorr. A solder layer is then formed on the nickel layer. The solder layer includes at least tin and lead, with the amount of tin contained in the solder layer being less than about 30 weight %.

BRIEF DESCRIPTION OF THE DRAWINGS

These and other objects and advantages of the present invention will become more apparent and will be more readily appreciated from the following detailed description of the presently preferred exemplary embodiments of the invention taken in conjunction with the accompanying drawings in which.

DESCRIPTION OF THE PREFERRED EMBODIMENTS

Figure 1A:
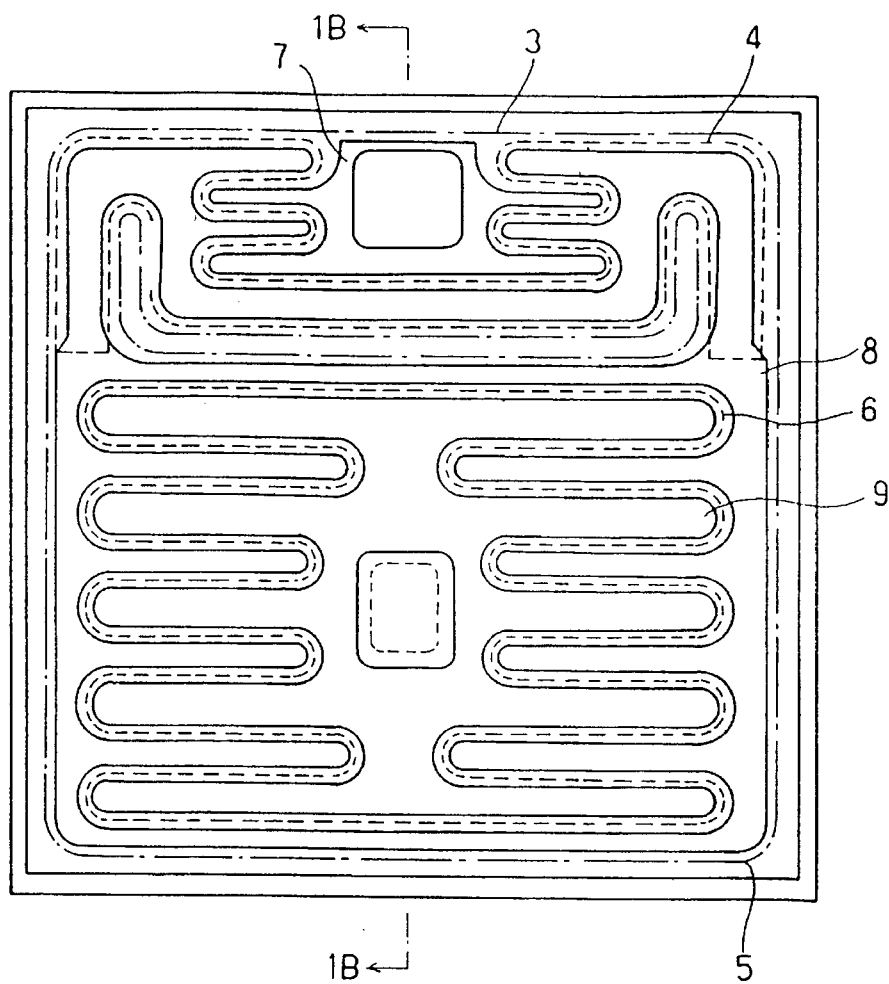
FIG. 1A is a plan view of a semiconductor device of a preferred embodiment of the present invention.
Figure 1B:
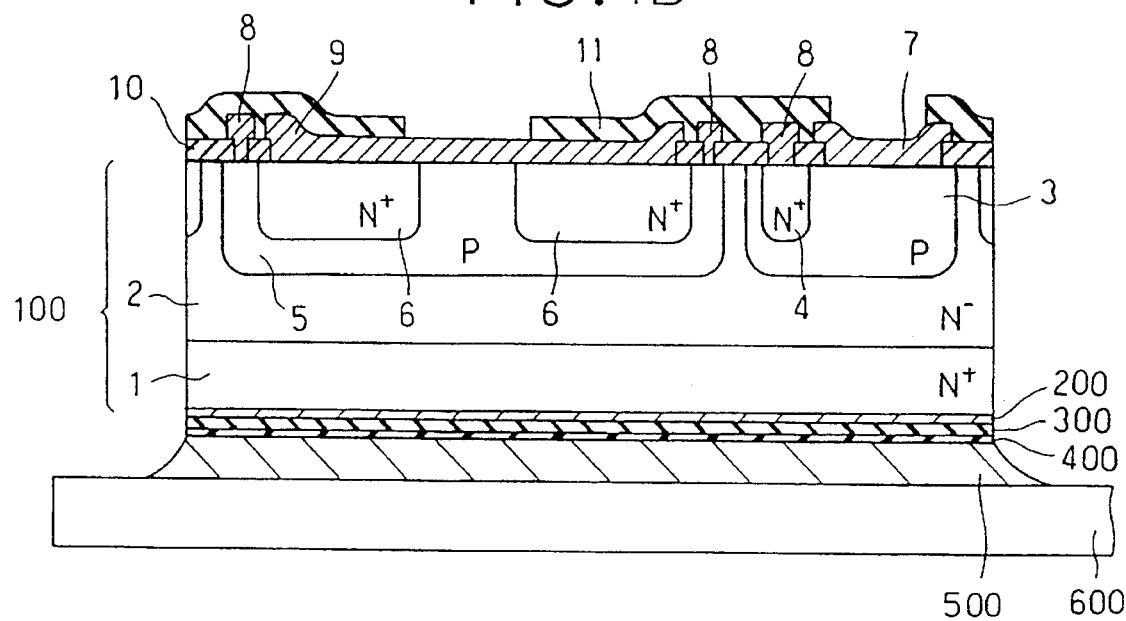
FIG. 1B is a sectional view taken along line B—B of FIG. 1A.

The preferred embodiments of the present invention will now be described with reference to the drawings. The process of forming this semiconductor device will be described in due order.

A power bipolar transistor having two Darlington connected transistors is formed in a silicon substrate 100 as a semiconductor substrate by well-known IC processes. Although a detailed explanation of the processes is omitted, the detailed structure and processes of the bipolar transistor may be found, for example, in U.S. Pat. No. 4,994,880 (corresponding to Japanese Unexamined Patent Publication (Kokai) No. 63-114259).

A low resistivity collector layer 1 and a high resistivity collector layer 2 constitute a collector region of first and second stage transistors. A silicon substrate 100 consists of the low resistivity collector layer 1 and the high resistivity collector layer 2. A base region 3 of the first stage transistor and a base region 5 of the second stage transistor are formed in the high resistivity collector layer 2. An emitter region 4 of the first stage transistor is formed in the base region 3. An emitter region 6 of the second stage transistor is formed in the base region 5. A silicon oxide film 10 is selectively formed on a portion of the main surface of the silicon substrate 100 and protects a P-N junction. A surface electrode 7 for the first stage base is formed on the base region 3 and electrically connected therewith. A surface electrode 8 for the first stage emitter region 4 and the second stage base region 5 is formed on these regions 4 and 5 and electrically connects the emitter region 4 with the base region 5. A surface electrode 9 for the second stage emitter is formed on the base region 5 and the emitter region 6 and electrically connected with these regions 5 and 6. A protecting film 11 is selectively formed on the surface electrodes 7, 8, 9 and silicon oxide 10.

Figure 7:
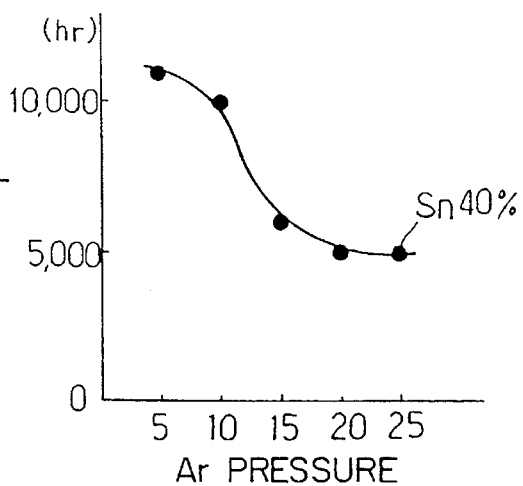
FIG. 7 shows the relationship between argon pressure and useful life.

After the elements are formed on the main surface of the silicon substrate 1, a rear electrode for the collector electrode is then formed on a rear surface of the silicon substrate 1. To form the rear electrode, a titanium (Ti) layer 200 having a thickness of about 2500 Å is formed by a sputtering on the rear surface of the silicon substrate 1 to make a strong connection with the silicon. A nickel (Ni) layer 300 having a thickness of about 6000 Å is coupled to the semiconductor substra formed on the titanium layer 200 by a method described in U.S. patient application Ser. No. 406,239 filed Sept. 12, 1989. Namely, the sputtering is carried out under the following conditions. The sputtering device is, for example, a DC parallel plane-type magnetron sputtering unit XM-8, manufactured by Varian. During the sputtering, the temperature of the silicon substrate 100 is kept in the range of 100 to 250° C. and the pressure of argon gas (i.e. the discharge gas) is adjusted to be at least 15 mTorr as shown in FIG. 7.

A gold (Au) layer 400 having a thickness of about 500 Å is then formed by a sputtering on the nickel layer 300.to prevent the nickel layer 300 from being oxidized. Thus, the rear electrode of the transistor consists of the titanium layer 200, the nickel layer 300, and the gold layer 400.

After the rear electrode is formed, a solder layer 500 is formed on the rear electrode to electrically connect the rear electrode with a lead frame 600, such as a heat sink (a plate for the radiation of heat) or the like. The materials of the solder layer 500 are tin (Sn) and lead (Pb), and the amount of tin contained in the solder layer 500 is not more than 30% by weight. By way of example 20% by weight works well. To accomplish the solder line, a ribbon of solder is cut to a predetermined size and is placed between the gold layer 400 and the lead frame 600. The gold layer 400 and the lead frame 600 are soldered together by the ribbon of solder in heated hydrogen.

The effects of the semiconductor device manufactured by the aforementioned processes will now be described.

Figure 2:
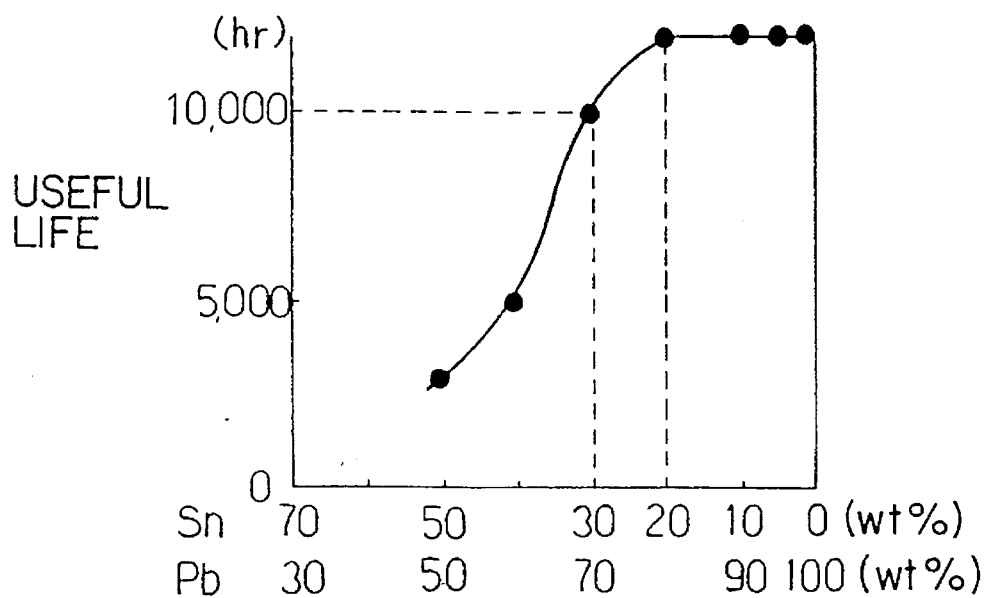
FIG. 2 shows a relationship between the amount of tin (Sn) contained in a solder layer and the useful life of the semiconductor.

FIG. 2 shows useful life of the rear electrode and the solder layer 500 when the amount of tin contained in the solder layer 500 was varied. The abscissa denotes the amount of tin (Sn) and the amount of lead (Pb) and the ordinate denotes the useful life. This test was a high-temperature exposing test that was carried out under the following conditions. The semiconductor device soldered on the heat sink was installed in an aluminum (Al) case which is in a thermoregulator at atmospheric pressure. The aluminum case was filled with silicone gel. The semiconductor device was then left at 150° C. (that is a maximum temperature at which the solder layer 500 is exposed after it is formed on the rear electrode). The useful life was defined as the duration until the adhesive strength began to reduce in a pull test in a perpendicular direction.

As shown in FIG. 2, when the amount of tin is less than 30% by weight, the useful life becomes extremely long and exceeds about 10000 hours. Such a useful life is longer than the operational life (i.e. driving time) of a normal car. Therefore, such a semiconductor device can be used as a device for a motor vehicle without any problems. It is noted that the use of a solder contains 20% tin also works well.

The reason why the useful life becomes extremely long when the amount of tin is less than about 30% weight will be described with reference to FIGS. 3 to 5.

Figure 3:
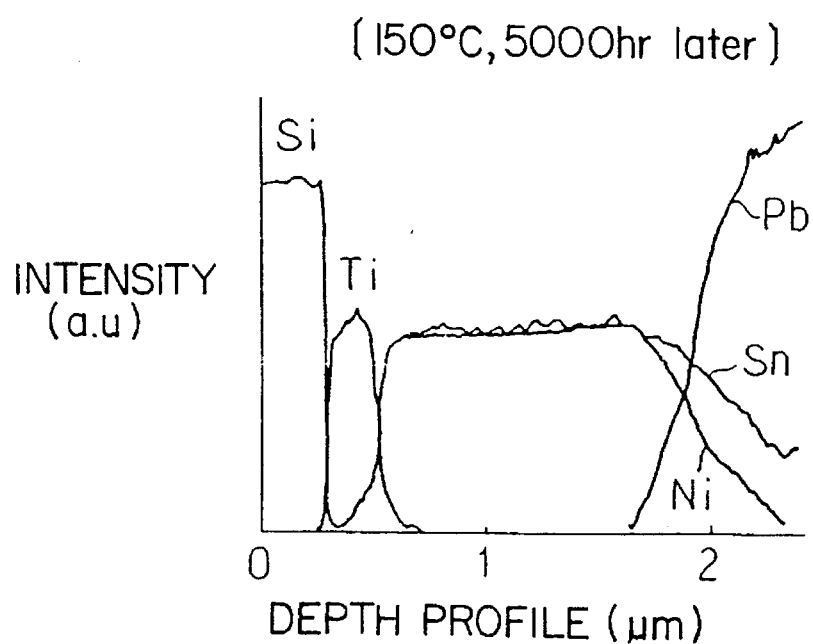
FIG. 3 shows an auger electron spectroscopy depth profile of a sample according to the present invention.

FIG. 3 shows an auger electron spectroscopy depth profile of a sample which has a solder layer 500 containing 20% tin. As shown in FIG. 3, when the amount of tin is 20%, lead does not exist at the interface between the titanium layer 200 and the nickel layer 300. The reason is believed to be as follows. When the amount of tin is small, it becomes impossible to dissolve sufficient lead into the tin. Therefore, even if the sample is put in a high-temperature atmosphere, lead can not diffuse in and pass through the nickel layer 300 and can not arrive at the interface between the titanium layer 200 and the nickel layer 300. Consequently, the adhesive strength of the sample is not reduced.

Figure 4:
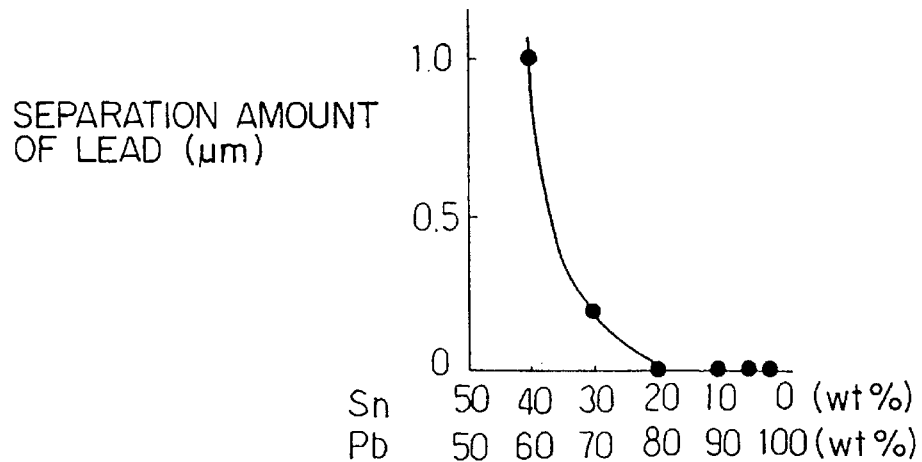
FIG. 4 shows the relationship between the amount of tin contained in the solder layer and the separation amount of lead (Pb) at an interface between a titanium layer and nickel layer.
Figure 5:
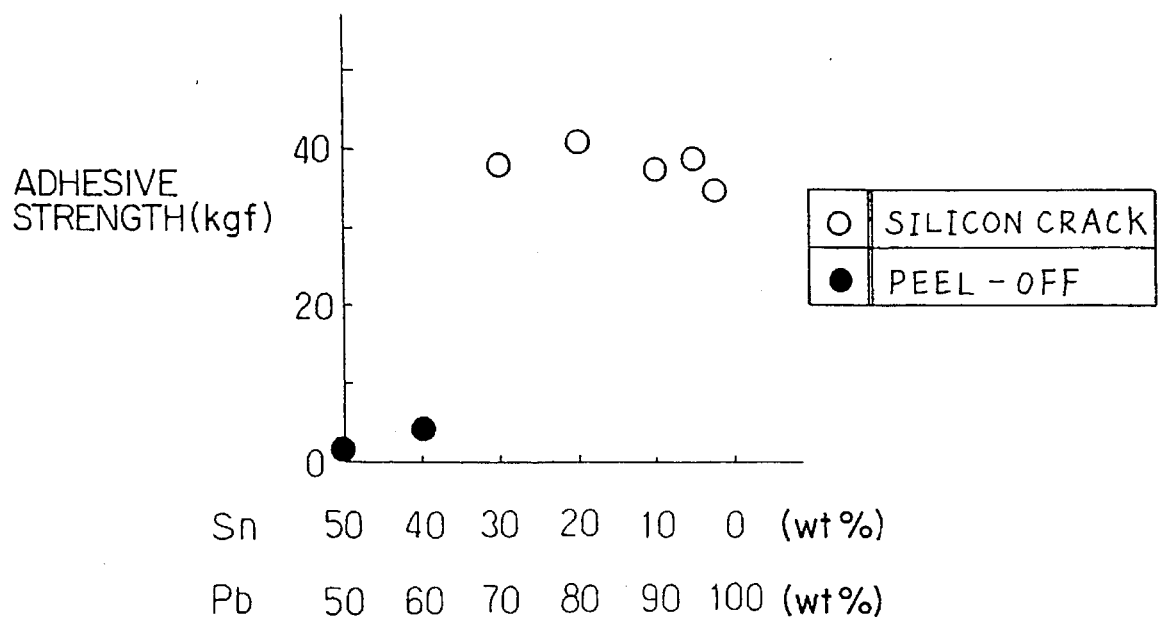
FIG. 5 shows the relationship between the amount of tin contained in a solder layer and the solder's adhesive strength.
Figure 8:
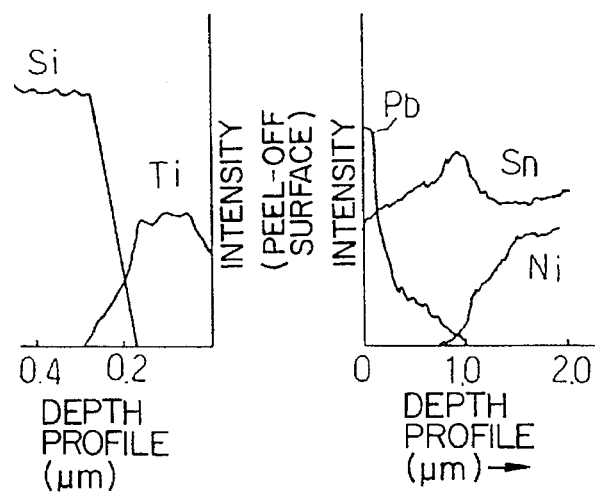
FIG. 8 shows an auger electron spectroscopy depth profile of the peel-off surfaces of a sample consisting of 40% tin and 60% lead by weight.

The aforementioned model is supported by the results shown in FIG. 4 and FIG. 5. FIG. 4 shows the separation amount of lead at the interface between the titanium layer 200 and the nickel layer 300 when the amount of tin was varied. FIG. 5 shows the adhesive strength when the amount of tin was varied. The separation amount of lead and the adhesive strength were measured after the sample had been put in an atmosphere of 150° C. for 5000 hours. According to FIG. 4 and FIG. 5, when the amount of tin is not more than 30% by weight, the separation amount of lead becomes extremely small, and the adhesive strength is increased in accordance with the separation amount. In FIG. 5, black circles (●) denote samples which peel-off occurred between the titanium layer 200 and lead. White circles (◯) denote samples in which silicon cracks occurred, namely, when a crack appeared the peel-off did not occur. This is because lead did not intervene between the titanium layer 200 and the nickel layer 300. FIG. 8 shows a depth profile for a peel-off surface.

It is to be noted that, when the amount of tin is less than approximately 20% by weight, the separation amount of lead is reduced to essentially 0(zero) and the useful life is maximized. Therefore, the amount of tin contained in the solder layer 500 is preferably less than about 20% by weight.

The present invention has been described with reference to the abovementioned embodiment, but the present invention is not limited to this embodiment and can be modified without departing from the spirit or concept of the present invention.

(1) In the aforementioned embodiment, it is described as a precondition of the present invention to sputter in the condition which the pressure of the argon gas as a discharge gas is not lower than 15 mTorr to form the nickel layer 300 on the rear surface of the silicon substrate 100. Here, as described in U.S. Ser. No. 406,239, when the sputtering is carried out in such a condition, a nickel layer, which has a ratio of an X-ray diffraction peak intensity of the (200) plane thereof to that of the (111) plane thereof of at least 10%, is formed. Therefore, such a structural precondition instead of the manufacturable precondition described in the aforementioned embodiment may be limited.

Figure 6:
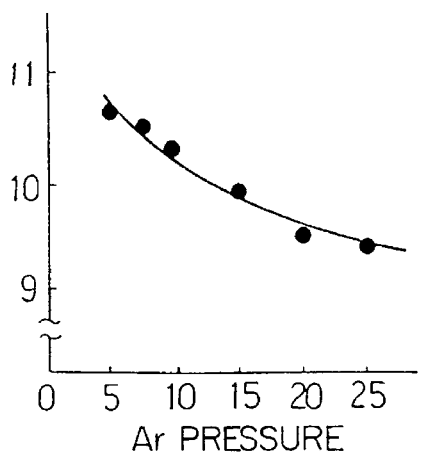
FIG. 6 shows a relationship between an argon pressure and a density of a nickel layer.

Moreover, with regard to an upper limitation of the pressure of the argon gas, as described in U.S. Ser. No. 406,239, the upper limitation should be 25 mTorr in concentration of electric resistivity. The above is graphically shown in FIG. 6.

(2) A chromium (Cr) layer, a vanadium (V) layer, or other layers may be formed between the silicon substrate 100 and the nickel layer 300 in place of the titanium layer 200. Alternatively, the nickel layer 300 may be directly formed on the silicon substrate 100 by omitting the titanium layer 200.

(3) A silver (Ag) layer or other layers may be formed in place of the gold layer 400.

(4) It is essential that the solder layer 500 includes at least tin and lead. However, the solder layer 500 may include an additive element, such as silver, antimony (SD), indium (In), bismuth (Bi), copper (Cu) or the like. A lower limitation of the amount of tin should be 1% by weight to form a good bond between the gold layer 400 with the lead frame 600.

(5) A soldering method on a hot plate instead of the aforementioned soldering method in heated hydrogen may be adopted.

(6) The present invention may be applied to a power MOSFET, an IGBT (Insulated Gate Bipolar Transistor), SIT (Static Induction Transistor), SI (State Induction) thyristor or the like other than the power bipolar transistor. In these semiconductor elements, current flows in a vertical direction (a direction of a thickness of a substrate).

What is claimed is:

1. A semiconductor device comprising:

a semiconductor substrate;

a nickel layer formed on said semiconductor substrate, the nickel layer having a radio of an X-ray diffraction peak intensity in the (200) plane to that of the (111) plane being at least 10%; and a solder layer formed on said nickel layer, and including at least tin and lead therein, the amount of tin contained in said solder layer being less than approximately 30% by weight said semiconductor device having a useful life of at least 10,000 hours.

2. A semiconductor device according to claim 1, wherein said semiconductor substrate has a semiconductor element therein.

3. A semiconductor device according to claim 2, wherein said semiconductor device is one which flows current in a vertical direction, perpendicular to a plane of the semiconductor substrate.

4. A semiconductor device according to claim 1, further comprising a connection layer formed between said semiconductor substrate and said nickel layer to strengthen connection with said semiconductor substrate.

5. A semiconductor device according to claim 4, wherein said connection layer contains a metal selected from the group consisting of titanium, chromium, and vanadium.

6. A semiconductor device according to claim 1, wherein said oxidation prevention layer contains a metal selected from the group consisting of gold and silver.

7. A semiconductor device according to claim 1, wherein said solder layer further includes an additive element.

8. A semiconductor device according to claim 7 wherein said additive element is an element selected from the group consisting of silver, antimony, indium, bismuth, and copper.

9. A semiconductor device according to claim 1, wherein a lower limitation of said amount of tin is approximately 1% by weight.

10. A semiconductor device according to claim 1, further comprising a lead frame connected with said solder layer.

11. A semiconductor device according to claim 1, wherein said amount of tin in said solder layer is less than approximately 20% by weight.

12. A semiconductor device comprising:

a semiconductor substrate;

a nickel layer coupled to said semiconductor substrate, the nickel layer having a ratio of an X-ray diffraction peak intensity in the (200) plane to that of the (111) plane that is at least 10%; and a solder layer formed adjacent said nickel layer, and including at least tin and lead therein, said solder layer including means for preventing lead in said solder layer from diffusing into said nickel layer, said semiconductor device having an expected useful life of at least 10,000 hours.

13. A semiconductor device comprising:

a semiconductor substrate;

a nickel layer coupled to said semiconductor substrate, the nickel layer having a ratio of an X-ray diffraction peak intensity in the (200) plane to that of the (111) plane that is at least 10%;

an oxidation prevention layer for preventing said nickel layer from being oxidized; and a solder layer;

said oxidation prevention layer being between said nickel layer and said solder layer, and said solder layer including at least tin and lead therein, an amount of tin contained in said solder layer being less than approximately 30% by weight, said semiconductor device having a useful life of at least 10,000 hours.

14. A semiconductor device according to claim 13, wherein said oxidation prevention layer contains a metal selected from the group consisting of gold and silver.

15. A semiconductor device comprising:

a semiconductor substrate;

a contact metal layer disposed on said semiconductor substrate;

a soldering metal layer comprising nickel disposed on said contact metal layer, having a ratio of an X-ray diffraction peak intensity in the Ni(200) plane to that of the Ni(111) plane that is at least 10%; and a solder layer disposed adjacent said soldering metal layer comprising nickel, said solder layer including at least tin and lead therein, an amount of tin contained in said solder layer being between 1% and 30% by weight, wherein lead contained in said solder layer does not exist at an interface between said contact metal layer and said soldering metal layer comprising nickel, said semiconductor device having a useful life of at least 10,000 hours.

16. A semiconductor device according to claim 15, wherein said amount of tin contained in said solder layer is less than approximately 20% by weight.

17. A semiconductor device according to claim 15, wherein said soldering metal layer comprising nickel has a region into which tin contained in said solder layer is diffused.

18. A semiconductor device according to claim 15, wherein said semiconductor substrate has a semiconductor element therein.

19. A semiconductor device according to claim 18, wherein said semiconductor element is one which flows current in a vertical direction, perpendicular to a plane of said semiconductor substrate.

20. A semiconductor device according to claim 15, wherein said contact metal layer comprises a metal selected from the group consisting of titanium, chromium and vanadium.

21. A semiconductor device according to claim 15, further comprising an oxidation prevention layer formed between said soldering metal layer comprising nickel and said solder layer.

22. A semiconductor device according to claim 21, wherein said oxidation prevention layer comprises a metal selected from the group consisting of gold and silver.

23. A semiconductor device according to claim 15, wherein said solder layer further includes an additive element.

24. A semiconductor device according to claim 23, wherein said additive element is an element selected from the group consisting of silver, antimony, indium, bismuth and copper.

25. A semiconductor device according to claim 15, further comprising a lead frame connected with said solder layer.

* * * * *